United States Patent [19]

Sato

[11] 4,358,780
[45] Nov. 9, 1982

[54] OPTICAL INFORMATION RECORD MEMBER

[75] Inventor: Noboru Sato, Yokohama, Japan

[73] Assignee: Sony Corporation, Tokyo, Japan

[21] Appl. No.: 282,178

[22] Filed: Jul. 10, 1981

[30] Foreign Application Priority Data

Jul. 18, 1980 [JP] Japan .................................. 55-99252

[51] Int. Cl.³ ............................................ G01D 15/34
[52] U.S. Cl. ................................ 346/135.1; 156/664; 346/76 L; 430/270; 430/945
[58] Field of Search ...................... 346/135.1, 76 L; 430/945, 270, 323, 318, 310; 156/664

[56] References Cited

U.S. PATENT DOCUMENTS

| | | | |
|---|---|---|---|
| 3,894,179 | 7/1975 | Jacobs | 430/945 X |
| 4,032,691 | 6/1977 | Kido | 346/76 L X |
| 4,087,281 | 5/1978 | Toda | 346/76 L X |

Primary Examiner—Joseph W. Hartary
Attorney, Agent, or Firm—Hill, Van Santen, Steadman, Chiara & Simpson

[57] ABSTRACT

An optical information record member having a substrate and an optical information carrier layer formed on the substrate is disclosed. The layer is composed of 40 to 80 atomic % of In and 60 to 20 atomic % of one of Se and S. The layer will be changed into a material which is insoluble to alkaline etchant upon the exposure to a light beam which is modulated in response to information signals to be recorded.

5 Claims, 22 Drawing Figures

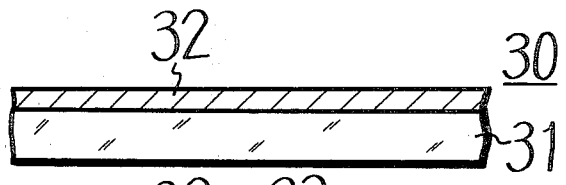
F I G. 12A
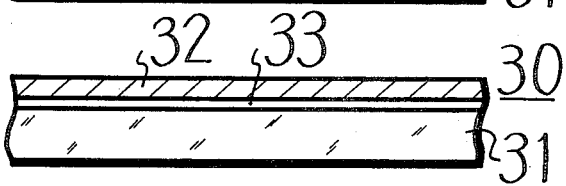
F I G. 12B
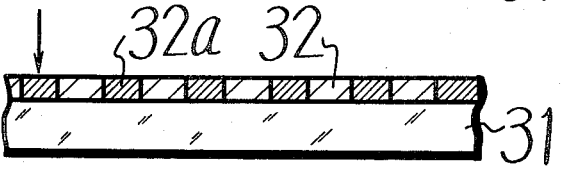
F I G. 13
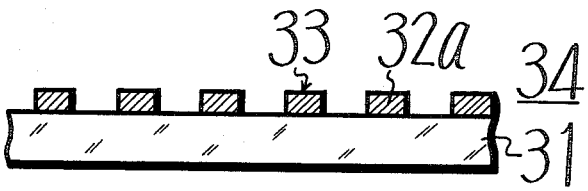
F I G. 14
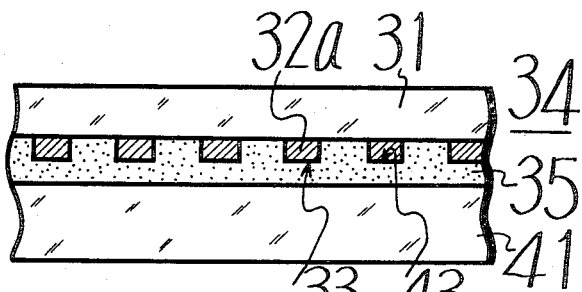
F I G. 15
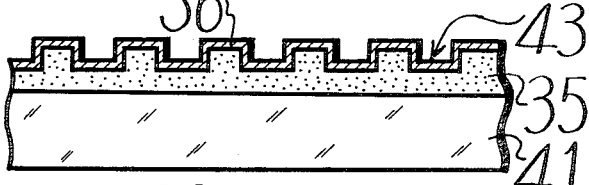
F I G. 16
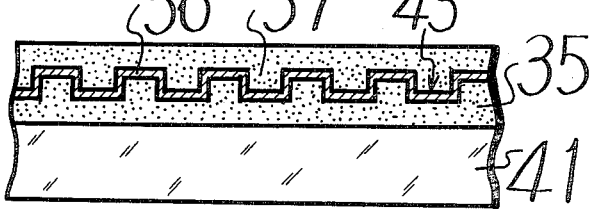
F I G. 17

OPTICAL INFORMATION RECORD MEMBER

BACKGROUND OF THE INVENTION

1. Field of the Invention

The present invention relates generally to an optical information record member, and is directed more particularly to an optical information record member suitable to make an optical information carrier and for use as an optical video disc, digital audio disc which is used in a system in which the record on the carrier is read out in an optical manner.

2. Description of the Prior Art

An example of the prior art reproducing apparatus, which reproduces an optical information recorded on an optical information carrier such as a video disc by the reflection manner, is depicted in FIG. 1. In this example, an optical information carrier 1 such as a video disc is rotatably supported about an axis 0 and, for example, a He-Ne laser tube 2 is provided to emit a laser beam 3 as a read-out light. This laser beam 3 is irradiated through, for example, a lens 4, a polarized beam splitter 5, a quarter plate 6, a tangential mirror 7, a tracking mirror 8 and an objective lens 9 on the optical information record surface, for example, concave-convex record surface of the video disc 1. The reflected light beam on the concave-convex surface of the video disc 1, which is modulated by the interference between reflected light beam is introduced through the objective lens 9, mirrors 8, 7, quarter plate 6 and polarized beam splitter 5 to a detector 10 such as a photo-diode which then converts the light beam into an electrical signal. Hence, the optical information recorded on the video disc 1 is optically reproduced.

In such optical information carrier 1, for example, video disc, as shown in FIG. 2, on a substrate 11 which is transparent to the read-out light such as the laser beam 3 (which will be referred hereinafter to as a light permeability) there is formed, for example, a pit i.e. concave-convex surface as an information record surface 14 on which a reflection coating made of, for example, an Al layer is formed. A protective resinous coating 13 of the U.V. hardening acrylic resin is coated on the reflection coating 12.

A method to provide such an information record carrier is a press-mold method. At first the press-mold method will be now described with reference to FIGS. 3 to 11. By this method, a master 20 is prepared first as shown in FIG. 3. The master 20 consists of, for example, a glass substrate 21 and a concave-convex surface 22 made of, for example, a photo-resist layer which is provided with recesses or cut-outs corresponding to pit portions of an information record surface of an information record carrier finally obtained by the irradiation of the laser beam which is modulated by the information signal to be recorded. The above concave-convex surface 22 may be formed by such a manner that the photo-resist layer is selectively exposed to the modulated laser beam and then non-exposed portions of the photo-resist layer are etched away.

Then, as shown in FIG. 4, for example, nickel is coated on the master 20 by electroless plating and subsequent electro-plating or the like to prepare a metal master 24 which comprises a convex-concave surface 23 corresponding to the concave-convex surface 22 on the master 20.

Then, the metal master 24 is peeled off from the master 20 as shown in FIG. 5.

Next, as shown in FIG. 6, metal plating, by way of example, is carried out on the convex-concave surface 23 of the metal master 24 to provide a mother 26 which comprises a concave-convex surface 25 corresponding to the convex-concave surface 23.

The mother 26 is peeled off from the metal master 24, as shown in FIG. 7.

As shown in FIG. 8, metal plating is further carried out on the mother 26 to provide a stamper 28 which has a convex-concave surface 27 corresponding to the concave-convex surface 25 of the mother 26.

The stamper 28 is then peeled off from the mother 26 as shown in FIG. 9.

By using the stamper 28 thus manufacture, thermoplastic resin such as acrylic resin or the like is pressmolded to provide a substrate 11 of the information record carrier on which a concave-convex information record surface 14 is formed as shown in FIG. 10.

Then, the substrate 11 is peeled off from the stamper 28 and then a reflection layer 12 made of, for example, Al is coated on the information record surface 14 of the substrate 11, and further a protective resinous coating 13 is formed on the reflection layer 12 as shown in FIG. 11. By this manner, the optical information carrier described in connection with FIG. 2 is provided.

According to the above method, since the concave-convex surface, which is to be the information surface, is successively transferred from the master to the metal master, the mother and the stamper, the information surface of the finally provided optical information record carrier 1 does not always represent high fidelity and the process thereof is rather complicated. The reason is as follows. In order to manufacture from one precisely prepared master a plurality of stampers which are abraded much, at first one master is prepared, then a plurality of mothers are provided from the master and then a plurality of stampers are provided from each of the plurality of mothers.

Further, in the above prior art method, in preparing the metal master, mother, and stampers, electroless plating and electro-plating are utilized, which takes a long time. This results in poor manufacture efficiency.

OBJECTS AND SUMMARY OF THE INVENTION

It is an object of the present invention to provide an improved optical information record member.

It is another object of the present invention to provide an optical information record member from which replicas can be easily manufactured.

It is a further object of the present invention to provide an improved optical information carrier which is produced from the optical information record member.

It is a still further object of the present invention to provide an optical information record member from which replicas can be directly stamped.

According to one aspect of the present invention, there is provided an optical information record member which comprises a substrate and an optical information carrier layer formed on the substrate which is composed of In and one of Se and S. The layer is changed into a material which is insoluble to alkaline etchant upon exposure to a light beam modulated according to information signal to be recorded on the carrier. An information pattern corresponding to the information signal is formed on the substrate by etching the unexposed portion of the layer.

The other objects, features and advantages of the present invention will become apparent from the following description taken in conjunction with the accompanying drawings through which the like references designate the same elements and parts.

BRIEF DESCRIPTION OF THE DRAWINGS

FIG. 12A and FIGS. 13 to 17 are respectively cross-sectional views showing an example of an optical information record member according to the present invention and an example of the method to provide an optical information carrier by using the optical information record member;

FIG. 12B is a cross-sectional view showing another example of the optical information record member according to the invention;

DESCRIPTION OF THE PREFERRED EMBODIMENTS

Figure 1:
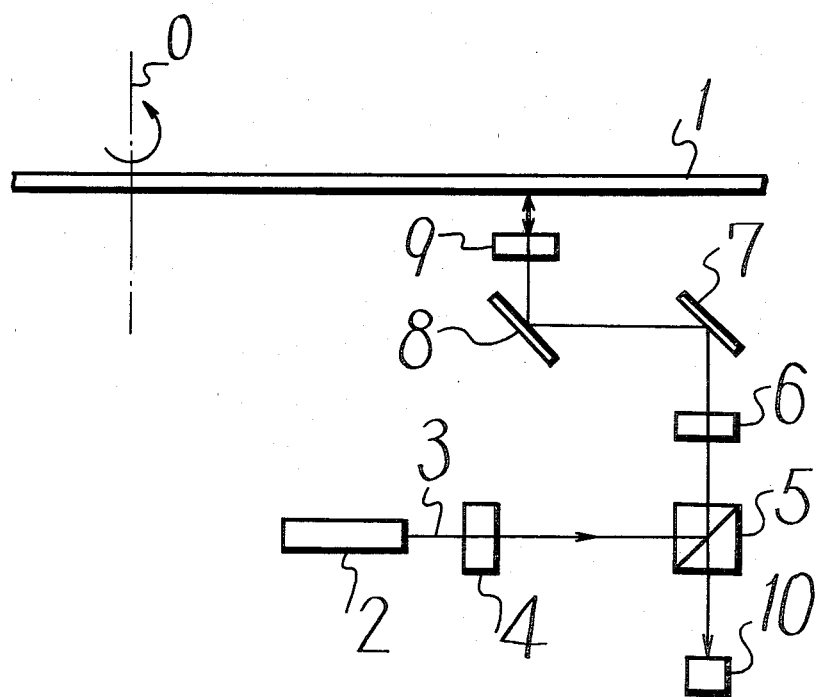
FIG. 1 is a schematic diagram showing the construction of an example of the optical information record and reproducing apparatus.
Figure 2:
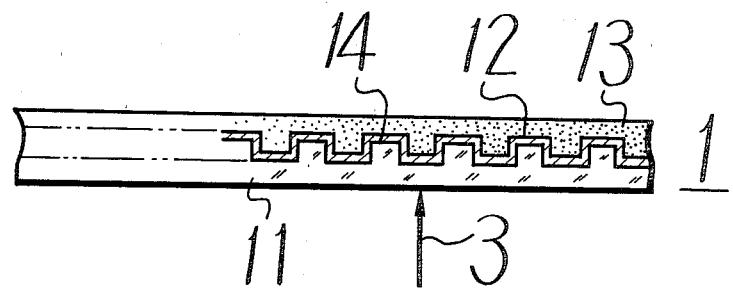
FIG. 2 is a cross-sectional view showing in an enlarged scale an example of the optical information carrier.
Figure 3:
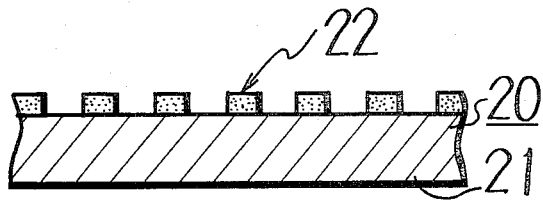
FIGS. 3 to 11 are respectively cross-sectional views showing a prior art process to make an optical information carrier.
Figure 4:
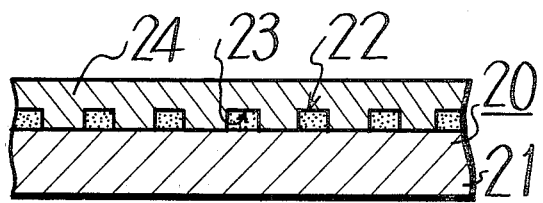
Figure 5:
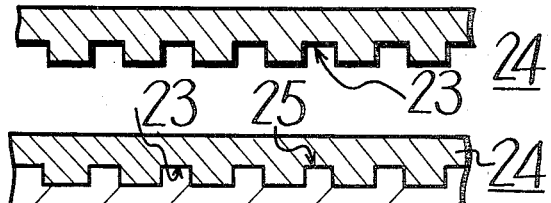
Figure 6:
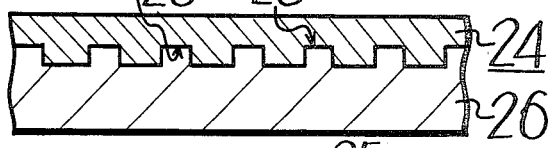
Figure 7:
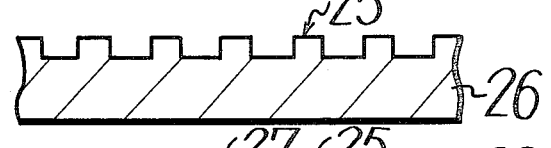
Figure 8:
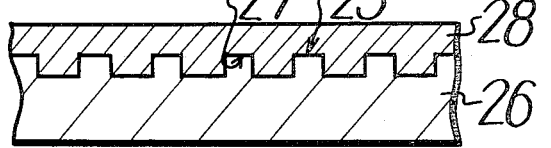

According to the present invention, an optical information record member, which corresponds to the above stamper and serves to provide an optical information carrier, is provided easily with high accuracy.

With the present invention, on a substrate such as a substrate made of a glass plate or the like with a smooth surface and formed flat, provided is an information record layer made of a metal layer or film. Then, a laser beam which is modulated in response to an information to be recorded is irradiated on the information record layer, and the irradiated portion of the information record layer is made insoluble or difficult to be soluble to aqueous alkaline solution. Thereafter, the portion of the information record layer other than the insoluble portion thereof are etched away by aqueous alkaline solution to form a convex-concave surface of the information on the surface of the information record layer. The convex-concave surface is formed of a plurality of hillocks. A substrate made of such as vinyl chloride resin, acrylic resin or the like and forming an optical information carrier is located on the convex-concave surface, which itself serves as the stamper, through photo-hardening resin or resin hardened by, for example, ultra violet radiation and then pressed. Then, ultra violet rays are irradiated thereon to harden the resin to provide an optical information carrier having a concave-convex surface transferred from the former convex-concave surface of the information record stamper.

The material employed in the invention as the information record layer is composed of In and Se or In and S. In this case, it is desired that the composition of the material is such that it contains 40 to 80 atomic % of In and the remainder of Se or S.

If the composition of the material is not fallen within the above range, when the etching treatment of the material is carried out by aqueous alkaline solution after the laser beam radiation, the formation of hillocks is not so good. That is, if In is contained excessively, the portion on which no laser beam is irradiated becomes hard to be etched away, while if Se or S is contained excessively the portion on which the laser beam is irradiated is also etched away. As the composition, it may be desired that the amount of In is selected as 60 to 80 atomic % and Se or S is selected as 40 to 20 atomic %, respectively.

The reason why by the laser beam radiation the insoluble portion is generated in the information record layer may be that the portion on which the laser beam is irradiated becomes glass or crystalline due to the heat generated therein by absorbing the laser beam.

The information record layer is formed by vacuum vaporization of, for example, In-Se alloy or In-S alloy. In this case, in consideration of the difference of scatterings between In and Se or S, the composition of vaporization source is selected to form a vacuum-evaporated layer of a desired composition.

The thickness of the information record layer is desired to be 500 to 2000 Å. If the thickness exceeds 2000 Å, much power is required upon recording and this thickness is undesirable for the fine working of a record pattern. If the thickness is less than 500 Å, upon reproduction the modulation degree can not be sufficiently presented, so that S/N ratio is deteriorated.

The etchant, aqueous alkaline solution used in this invention may be, for example, aqueous solution of KOH or NaOH containing 5 to 20% of solute.

The information record layer of this invention may be formed directly or through a vacuum-evaporated layer of Cr on a substrate made of glass or the like. By the employment of the Cr layer as the under coating layer, the bonding property of the information record layer to the substrate can be increased. The thickness of the Cr layer may be desired more than 50 Å, preferably 50 to 500 Å.

Now, with reference to FIG. 12A and FIGS. 13 to 17, an information record member according to the invention and an example of the method to make an information record carrier such as a video disc based upon the information record member along the processes.

EXAMPLE 1

At first, as shown in FIG. 12A, a substrate 31 such as a glass substrate is prepared which, as described in connection with FIG. 1, has the light permeability for the laser beam and also the permeability for an exposure light for photo-hardening resin described later such as ultra violet rays, is superior in flatness and in smoothness, 350 mm in diameter and 5 mm in thickness. In-Se alloy layer is coated on the glass substrate 31 at the thickness of, for example, 1000 Å by the resistive heating method from a vacuum evaporation source of In:-Se=50:50 (atomic ratio) to form an information record layer 32. Thus, an information record member 30 according to this invention is provided. The information record layer 32 thus made contained 70 atomic % of In and 30 atomic % of Se.

FIG. 12B shows another example of the information record member 30 in which a vacuum-evaporated layer 33 of Cr is used as the under coating layer for the information record layer 32 made of In-Se.

The information record member 30 provided with the information record layer 32 is rotated at the rotating speed of 1800 rpm, while a light modulator is used to irradiate an Ar laser beam (wave length of 4965 Å), which is modulated as a pulse form in accordance with a video signal to be recorded, on the rotating information record layer 32 to thereby record the information thereon.

By this irradiation, portions of the information record layer 32 on which the laser beam are irradiated become portions 32a which are insoluble to aqueous alkaline solution as shown in FIG. 13.

Figure 9:
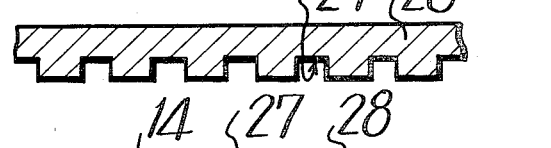
Figure 10:
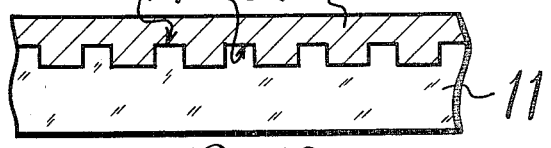
Figure 11:
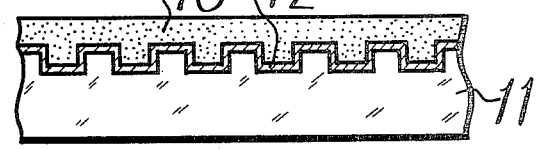

Thereafter, if the information record layer 32 is subjected to the etching treatment by aqueous alkaline solution such as 10% of aqueous sodium hydroxides solution, the portions 32a which are irradiated with the laser beam and hence become insoluble to aqueous alkaline solution remain on the glass substrate 31 to provide thereon a convex-concave surface 33, in this case, formed of a plurality of hillocks, in accordance with the information to be recorded. Thus, a record member 34 which corresponds to the stamper 28 described in connection with FIG. 9 is prepared as shown in FIG. 14.

Next, as shown in FIG. 15, on the convex-concave surface 33 of the member 34 or surface on which the insoluble portions 32a are remained, a plate 41 made of acrylic resin or vinyl chloride resin or the like, which is in light permeability for a read-out light beam, is pressed through photo-hardening resin 35 such as resin hardened by the ultra violet ray irradiation to form a concave-convex record surface 43 on the photo-hardening resin 35 in response to the convex-concave surface 33 of the insoluble portions 32a of the member 34 while the photo-hardening resin 35 is not hardened. Under such a state, light such as ultra violet rays which will harden the photo-hardening resin 35 are irradiated through the substrate 31 of the member 34 on all the photo-hardening resin 35 to harden the same.

Thereafter, as shown in FIG. 16, the record member (stamper) 34 is peeled off and then aluminum (Al) is coated on the photo-hardening resin 35 by, for example, vacuum evaporation or sputtering to form a reflection coating 36.

Then, as shown in FIG. 17, a protective resinous coating 37 is formed on the reflection coating 36. Thus, a desired optical information record carrier 1 such as a video disc with the necessary concave-convex information surface 43 was made.

When the video signal was reproduced from the video disc thus made by using the reproducing system shown in FIG. 1, the C/N (chroma-noise ratio) was 42 dB which will mean that the video disc can be practically used.

EXAMPLE 2

In place of In-Se layer used in the Example 1, an information record layer consisting of In and S is formed by using an evaporation source of $In_2S_3$ composition alloy. This is then treated by the process similar to Example 1 to provide an information record carrier.

As described above, according to the present invention, the metal layer 32, which will become insoluble or difficult to be soluble to aqueous alkaline solution, is coated on the substrate 31 and then is irradiated with the laser beam, which is modulated directly in accordance with the information to be recorded, to make the irradiated portions of layer 32 insoluble or hard to be soluble. Then, the layer 32 is subjected to the etching by aqueous alkaline solution to be a pattern to thereby directly provide the member 34 which corresponds to the stamper or master. Therefore, by the present invention, upon making the information record carrier 1, the process to repeatedly transfer the concave-convex surface from one to another can be avoided or reduced so that the information can be recorded with high fidelity and the process to make the information record carrier can be much simplified.

Further, since, according to the invention, a number of plating processes required in the prior art can be reduced or avoided, the making process of the information record can be simplified.

In the invention, if such glass plates which are mirror-polished with high accuracy are employed as the substrate 31, the scattering existing in the substrate of the prior art plated stamper can be avoided and the information record surface can be provided at more high accuracy.

According to the method described in connection with FIG. 12A and FIGS. 13 to 17, upon molding of the resin material 35, if air is mixed between the member 34 and resin material 35, air bubbles are generated and cause scattering in optical thickness, which will deteriorate the S/N ratio. Therefore, it is desired that the above-mentioned air bubbles are not formed in the resin material 35.

In order to avoid the formation of air bubbles in the resin material 35, the following method of manufacturing the information record carrier 1 is effective as will be described in connection with FIGS. 18 to 21.

Figure 18:
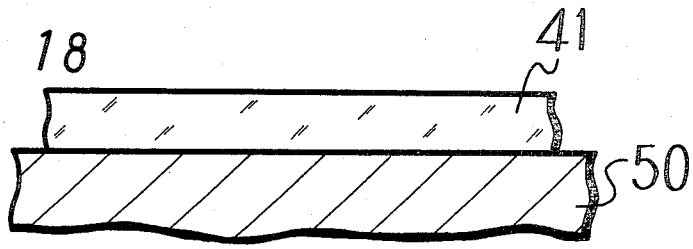
FIGS. 18 to 21 are respectively cross-sectional views used to explain another method to make an optical information carrier.
Figure 19:
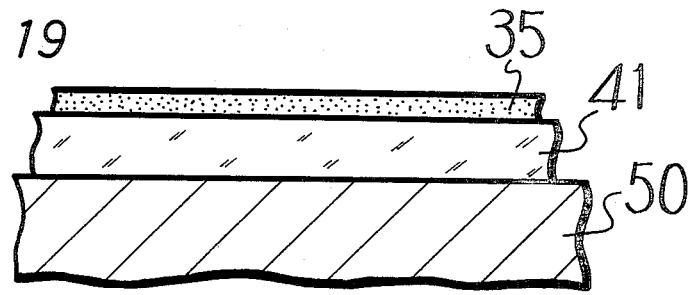

According to this method, as shown in FIG. 18, a light permeable support 50 is provided for a photo-hardening resin which will be described later. A plate 41 described in connection with FIG. 15 is mounted on the support 50. Then, as shown in FIG. 19, a photo-hardening resin 35 is coated on the plate 41 by the screen-printing method, roll-transfer method or the like and then they are passed through a slitter formed of nife-edges and so on to be constant in thickness, if necessary.

Figure 20:
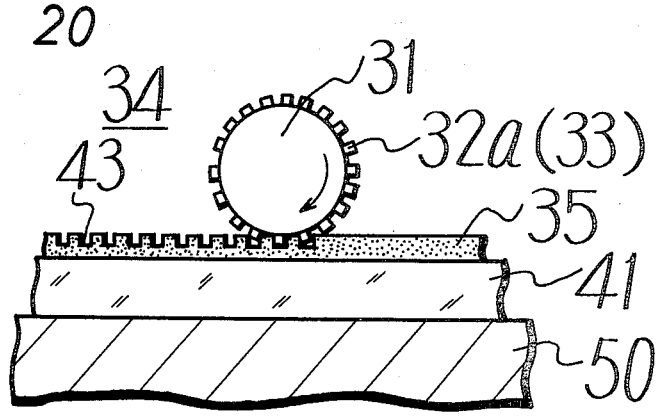
Figure 21:
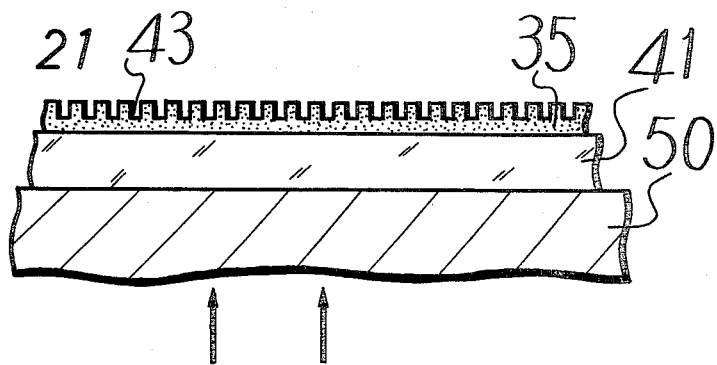

While, as shown in FIG. 20, a convex-concave surface 33 consisting of an insoluble portion 32a is formed on the outer peripheral surface of a rotary roll substrate 31 by the manner similar to that described in connection with FIGS. 12 to 14 to form a roll-shaped information record member 34. That is, in the similar method explained with reference to FIGS. 12 to 14, the rotary roll substrate 31 is used in place of the plate-shaped substrate 31 and the above-mentioned record layer 32 is formed on the peripheral surface of the roll substrate 31. Then, the record layer 32 is exposed to light and then subjected to the etching treatment to thereby provide the roll-shaped member 34. This member 34 is pushed to the non-hardened resin material 35 and then rotated to transfer the convex-concave information surface 33 to the resin material 35. Thus, a concave-convex surface 43 is formed on the resin material 35. Thereafter, as shown in FIG. 21, for example, ultra violet rays are irradiated through the support 50 on the resin material 35 to harden the same. Then, the plate 41 is peeled off from the support 50 and then subjected to the exposure process to be hardened completely if necessary. Thereafter, similar to as described in connection with FIGS. 16 and 17, a reflection coating 36 and a protective resinous coating 37 (through not shown in FIG. 21), respectively on the surface 43 to provide an aimed or desired optical information record carrier 1.

According to the information record carrier 1, the concave-convex information surface 33 of the roll member 34 is transferred to the carrier 1 in one direction rotation under being urged, so that air in the resin material 35 of carrier 1 is pushed out therefrom and hence the formation of air foams can be avoided.

Further, according to the present invention, prior to the process to carry out the molding by using the photohardening resin shown in FIG. 15, the information record surface 33 of the information record member 30 is subjected to pre-treatment to make it easy that the resin 35 is peeled off from the member 30. The pre-treatment may be such that, for example, the information record member 30 is treated by aqueous Pd compound solution to deposit metal Pd on the information record surface 33. This may be considered that the above pre-treatment make the fine concave portions of the information record surface 33 smooth by the deposition of metal Pd and hence the peeling-off of the resin 35 from the information record member 34 becomes easy.

I claim as my invention:

1. An optical information record member, comprising a substrate and an optical information carrier layer formed on said substrate, said layer being composed of 40 to 80 atomic % of In and 60 to 20 atomic % of one of Se and S, said layer being changed into a material which is insoluble to alkaline etchant upon exposure to a light beam modulated according to information signals.

2. An optical information record member according to claim 1, wherein said layer has a thickness between 500 and 2000 Å.

3. An optical information record member according to claim 1, wherein said layer is composed of 60 to 80 atomic % of In and 40 to 20 atomic % of one of Se and S.

4. An optical information record member according to claim 1, said carrier further comprises a layer of Cr interposed between said substrate and said optical information carrier layer.

5. An optical information record member according to claim 4, said layer of Cr has a thickness greater than 50 Å.

* * * * *